(12) United States Patent
Dempsey

(10) Patent No.: US 7,248,450 B1
(45) Date of Patent: Jul. 24, 2007

(54) PAD CELL WITH MULTIPLE SIGNAL PATHS

(75) Inventor: Dennis A. Dempsey, Crecora (IE)

(73) Assignee: Analog Devices, Inc., Norwood, MA (US)

( * ) Notice: Subject to any disclaimer, the term of this patent is extended or adjusted under 35 U.S.C. 154(b) by 278 days.

(21) Appl. No.: 10/824,850

(22) Filed: Apr. 15, 2004

(51) Int. Cl.
H02H 9/30 (2006.01)
H02H 9/56 (2006.01)
H01H 73/18 (2006.01)

(52) U.S. Cl. ...................................... 361/10
(58) Field of Classification Search ............ 361/10
See application file for complete search history.

(56) References Cited

U.S. PATENT DOCUMENTS

| 5,164,659 | A | * | 11/1992 | Schultz et al. | 323/351 |
| 5,602,409 | A | | 2/1997 | Olney | |
| 5,751,525 | A | | 5/1998 | Olney | |
| 6,236,087 | B1 | | 5/2001 | Daly et al. | |
| 6,329,863 | B1 | * | 12/2001 | Lee et al. | 327/309 |
| 6,550,664 | B2 | * | 4/2003 | Bradley et al. | 228/179.1 |
| 6,750,517 | B1 | * | 6/2004 | Ker et al. | 257/401 |
| 2002/0033504 | A1 | * | 3/2002 | Ohnakado | 257/350 |
| 2004/0001018 | A1 | * | 1/2004 | Hales | 341/155 |
| 2005/0224883 | A1 | * | 10/2005 | Huang et al. | 257/355 |

OTHER PUBLICATIONS

Razavi, B., Chap 18—*Design of Analog CMOS Integrated Circuits*, McGraw Hill, International Edition 2001, pp. 657-660.

* cited by examiner

*Primary Examiner*—Stephen W. Jackson
*Assistant Examiner*—Dharti H. Patel
(74) *Attorney, Agent, or Firm*—Wolf, Greenfield & Sacks P.C.

(57) ABSTRACT

An integrated circuit is described including internal circuitry and having at least one external connection. A pad cell is electrically interposed between the external connection and the internal circuitry, the pad cell comprising a first group of components adapted to protect the internal circuitry from transients at the external connection and providing, during normal operating conditions of the integrated circuit, a first signal path to the internal circuitry, and a second group of components providing a second signal path from the external connection to the internal circuitry. The second signal path is non-operable during the normal operating conditions but on application of a predefined voltage at the external connection becomes operable.

44 Claims, 3 Drawing Sheets

PAD CELL WITH MULTIPLE SIGNAL PATHS

FIELD OF THE INVENTION

The present invention relates to pad cells and in particular to a low leakage pad cell design including multiple signal paths. The invention more particularly relates to low leakage pad cell design that is provided with a robust ESD performance.

BACKGROUND OF THE INVENTION

Pad cells or pads facilitate the interface between the macroscopic world of BNC cables, lab benches, manual and automated handling equipment, oscilloscopes, and signal generators and the microscopic world of the core of an integrated circuit. Output pads include buffers with current driving capability sufficient to drive off-chip loads with the desired transient response. Input and Input/Output (IO) pads include some measure of protection against damage due to an electrostatic discharge (ESD) event. Further information on pads and ESD protection can be found in Chapter 18, pages 657-660 of "Design of Analog CMOS Integrated Circuits" International Edition 2001 as published by McGraw Hill, the contents of which are incorporated by reference.

As is described in U.S. Pat. No. 5,751,525, co-assigned to the assignee of the present invention and incorporated herein by reference, integrated circuits are vulnerable to electrical overstress (EOS). EOS results from an external source discharging large transient voltages onto one or more pins of an integrated circuit. These transient voltages can include very fast transients such as those produced by an electrostatic discharge (ESD) event, or slower transients such as may result from power-line surges.

ESD events can have differing characteristics due to the equivalent circuitry present. The human body model (HBM) correlates to a human-induced ESD event. The machine model (MM) correlates to a machine-induced ESD event. The field-induced charge device model (FICDM) relates to an ESD event induced by the discharge of the device through a pin.

ESD is a well-known cause of failure in integrated circuits (ICs), especially integrated circuits manufactured using MOS processes, but also, albeit to a lesser extent, those produced by bipolar processes. MOS devices sustain two types of permanent damage as a result of ESD. In MOS devices, the thin oxide layer of input gates cannot support high voltages without incurring damage. Where the input voltage across a diode junction becomes excessive, breakdown damage will occur when the EOS current becomes excessive. Secondly, the source/drain junction diodes may get damaged if they carry a large current in forward or reverse bias, thereby creating a short to the bulk (well) of the device or creating an open circuit. This diode junction breakdown occurs in both bipolar junction transistor (BJT) and MOS devices. Input protection circuits are frequently used in integrated circuits to protect against such failures and are normally provided within a pad cell so as to prevent the ESD interfacing with and corrupting the circuitry of the main portion of the integrated circuit. In addition to U.S. Pat. No. 5,751,525, U.S. Pat. Nos. 5,602,409 and 6,236,087 both describe a number of exemplary protection circuits that may be provided to obviate the effect of ESD within an IC environment.

It is also known that a pad cell may be provided with two or more signal paths for interfacing with the internal circuitry of the IC. Typically, a first signal path is operable for normal operating conditions and the second signal path is effective by specific input signals applied to the input pin of the IC. A reason for such multiple signal paths is to enable dual or multiple usage of the same input pin of the IC. It will be appreciated that when an IC is to be operated in test mode or some other non-normal application that it is sometimes necessary to access hardware and/or functions within the IC that is, or are, normally not used. To obviate the need to provide a specific input pin to enable this interface, it is common to provide a pin with multiple configurations such that it may be re-configured into a test mode if required. This ensures that a packaged IC is not provided with redundant pins, and as such the area of the chip can be reduced. Similarly, if the circuitry is to be used in JTAG (Joint Test Action Group) boundary scan testing or similar environment where a hardware method of talking to memory and flash without requiring any application running on the hardware is implemented, then it is important that there is provided a methodology for interfacing with the specific circuits of the IC without requiring additional pins.

A further example of multiple pin usage is three-state bus and IO usage. In this case, the pin function can alternate between read and a write functions, as defined by a shared RD/WR input.

Yet another example of multiple pin usages are devices, such as the Analog Devices ADµC812 product, which have user-definable pin interface re-configuration so that a user can define how the interface pins are to be used, depending on the application or specific requirement at the time.

There is therefore a need to provide an interface to an integrated circuit package that enables multiple pin functionality yet does not lead to current leakage within the circuit. There is additionally a need to provide a circuit that can operate with and in parallel to known ESD protection circuits to provide alternative communication input paths from a pin to circuitry within the IC so as to maximize the usage of the pin(s), reduce pin count, package area, package cost and the number of PCB signals required.

SUMMARY OF THE INVENTION

These and other needs of the prior art are addressed by a pad cell configuration according to the present invention which provides first and second signal paths to internal circuitry of an integrated circuit. Accordingly, a first embodiment of the invention provides an integrated circuit having at least one input pin, the input pin being coupled to a pad cell adapted to provide a first interface from circuitry external to the integrated circuit via the input pin to components of the integrated circuit thereby providing a first communication path and wherein the integrated circuit includes a second communication path, the second communication path being coupled to the input pin and adapted to provide a second interface from circuitry external to the integrated circuit via the input pin to components of the integrated circuit, and wherein the second communication path is operable on application of a pre-defined signal to the input pin, the operation of the second communication path being parallel to and simultaneous with the operation of the first communication path.

The invention also provides an integrated circuit having at least one external connection pin, the pin being coupled to a pad cell adapted to provide a signal path from circuitry external to the integrated circuit via the pin to components of the integrated circuit. The pad cell includes a first signal path being operational under a first set of normal operating conditions and a second signal path. The second signal path is non-operable under the first set of normal operating conditions and operable on application of a pre-defined signal to the pin, the operation of the second signal path being parallel to and simultaneous with the operation of the first signal path.

The second signal path desirably includes a MOS transistor device, the source and well of the device being coupled to one another. The source and well are preferably additionally coupled to the pin.

The second signal path typically additionally includes comparator circuitry, which may in certain embodiments include a digital gate and/or an analog amplifier.

If an amplifier is provided it may be configured as an inverter.

The comparator circuitry is usually coupled in series to a first MOS device. The comparator circuitry usually includes a first input coupled to the MOS device, a second input adapted to provide a signal with which the signal coupled from the MOS device is compared with, and an output, the output depending on the comparison effected between the first and second inputs.

The comparator circuitry may be configured as a current comparator or alternatively configured as a voltage comparator.

An analog filter may be provided between the MOS device and the comparator circuitry so as to desensitise the comparator circuit. Similarly, a digital filter may be provided at the output of the comparator circuitry.

Certain embodiments may provide the comparator circuitry configured as a SAR ADC or in other embodiments as a flash ADC.

The circuit may further comprise at least one additional MOS device provided in the path between the first MOS device and the input to the comparator circuitry.

Preferred embodiments of the first signal path include an up/down diode configuration adapted to provide protection from electrostatic discharge events. The first signal path may additionally include an impedance element and/or a digital buffer in series with the up/down diode configuration.

The second signal path may additionally be coupled to an impedance device such that when the second signal path is operable, the pin sources current through the MOS device across the impedance, thereby causing the comparator circuitry to change its output. The impedance device may be an active component or a passive component.

The second signal path may be replicated such that the pad cell provides multiple signal paths that may be operable simultaneously with and in parallel to the first signal path. Each of the multiple signal paths of the pad cell, if provided, are typically individually operable such that at any one time only one signal path of the multiple signal paths is operable.

The pre-defined signal is usually a signal of larger magnitude than the first set of normal operating conditions.

In a further embodiment the invention provides an integrated circuit comprising:
  internal circuitry,
  at least one external connection,
  a pad cell electrically interposed between an external connection and the internal circuitry, the pad cell comprising:
    a first group of components adapted to protect the internal circuitry from transients at the external connection and providing, during normal operating conditions of the integrated circuit, a first signal path to the internal circuitry,
    a second group of components providing a second signal path from the external connection to the internal circuitry and wherein the second signal path is non-operable during the normal operating conditions but on application of a predefined voltage at the external connection becomes operable, the first and second signal paths being simultaneously operable.

In yet a further embodiment of the present invention an integrated circuit is provided which comprises internal circuitry, at least one external connection, a pad cell electrically interposed between an external connection and the internal circuitry, the pad cell comprising:
  a first group of components providing, during normal operating conditions of the integrated circuit, a first signal path to the internal circuitry,
  a second group of components providing a second signal path from the external connection to the internal circuitry and wherein the second signal path is non-operable during the normal operating conditions but on application of a predefined voltage at the external connection becomes operable, the second group of components including a MOS device having the source and well coupled together, the application of the predefined voltage turning the MOS device on and enabling the second signal path.

In such a circuit, the pad cell may further include circuit components adapted to protect the internal circuitry from transients at the external connection. Such circuit components may be provided in either or/both of the first and second signal paths.

The pad cell may be configured such that during operation of the second signal path the first signal path in not operable. Such non-operation may be result from the first signal path just not being used, but still being available for use or indeed the first signal path may be disabled.

The second signal path may include components which may be configured to disable the second signal path in either a temporary or permanent fashion. This disablement may be effected so as to prevent the second signal path being activated or used at any time during operation of the circuit or just when the predetermined voltage is applied at the external connection.

These and other features of the present invention will be better understood with reference to the following drawings.

BRIEF DESCRIPTION OF THE DRAWINGS

The present invention will now be described with reference to the accompanying drawings in which.

DETAILED DESCRIPTION OF THE DRAWINGS

Figure 1:
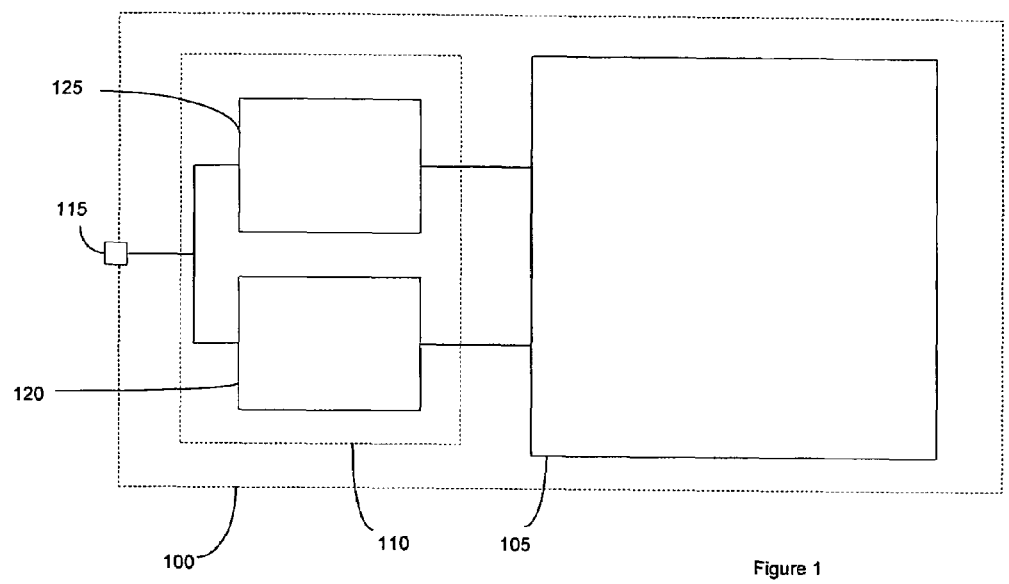
FIG. 1 is a schematic showing an integrated circuit in accordance with the present invention.

FIG. 1 shows in block schematic form, an integrated circuit 100 in accordance with the present invention. The circuit 100 includes internal circuit components 105 which, as will be appreciated by those skilled in the art, will be specific to the activity or function of the circuit. At least one external connection pin 115 which may be either an input, output or dual function pin is provided and is coupled to a pad cell 110 adapted to provide a signal path from circuitry external to the integrated circuit via the pin to the internal components of the integrated circuit. Typically, as will be appreciated by those skilled in the art an integrated circuit package is provided in a multiple pin configuration such as having 8 or 16 pins, but for the sake of explanation FIG. 1 only shows a single pin.

The pad cell includes a first signal path 120 being operational under a first set of normal operating conditions and a second signal path 125 which may be brought into operation by application of a specific signal combination applied to the pin. The first or second signal path may include a group of components that are adapted to protect the internal circuitry from transients at the external connection and provide ESD protection to the internal circuitry of the circuit. During normal operating conditions of the integrated circuit, a first signal path to the internal circuitry is provided by the first signal path 120, and usually the only components within that first signal path are ESD protection circuit components. The second signal path includes a second group of components providing a second signal path from the external connection to the internal circuitry. In accordance with the invention, the second signal path is non-operable under the first set of normal operating conditions and operable on application of a pre-defined signal to the pin, the operation of the second signal path being parallel to and simultaneous with the operation of the first signal path. As such the pad cell configuration of the present invention may be configured to provide multiple signal paths from the same pin at the same time. In certain applications the first signal path may be available but not operable such as in the example of where an analog signal path is provided but the headroom available is not sufficient for normal operation.

Figure 2:
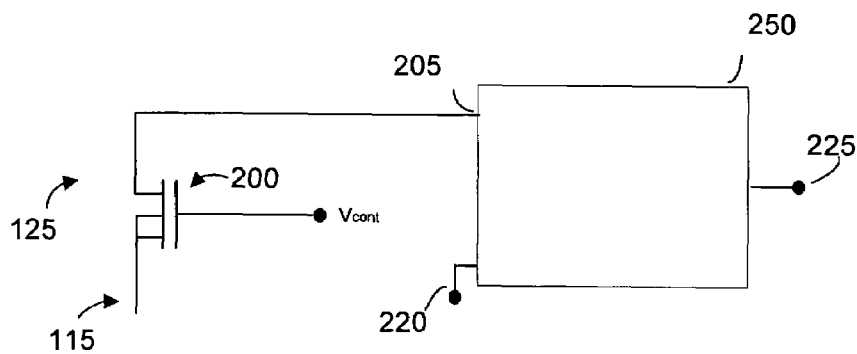
FIG. 2 is an example of the type of circuit components that can be provided within the second signal path of the pad cell.

FIG. 2 is an example of the type of circuit components that may be provided within the second signal path. On a top level, the second signal path includes a MOS device 200 coupled in series to a comparator 250. It will be understood that a MOS device is a symmetric device with the annotation of the terminals as source or drain being interchangeable. However, when a first terminal is coupled to the back gate of the device, that terminal is conventionally referred to as the source. This means, by default, that the second terminal may be referred to as the drain. The MOS device 200 of FIG. 2 is configured such that the source and back gate of the device are both coupled to the pin 115. The drain of the MOS device is coupled to a first input 205 of the comparator 250. A second input 220 of the comparator may be coupled to a reference signal. As such an output 225 of the comparator changes as an indication of differences between the signals provided at the first and second inputs. The reference signal may be coupled to a voltage or current reference and may indeed be a programmable reference.

Figure 3:
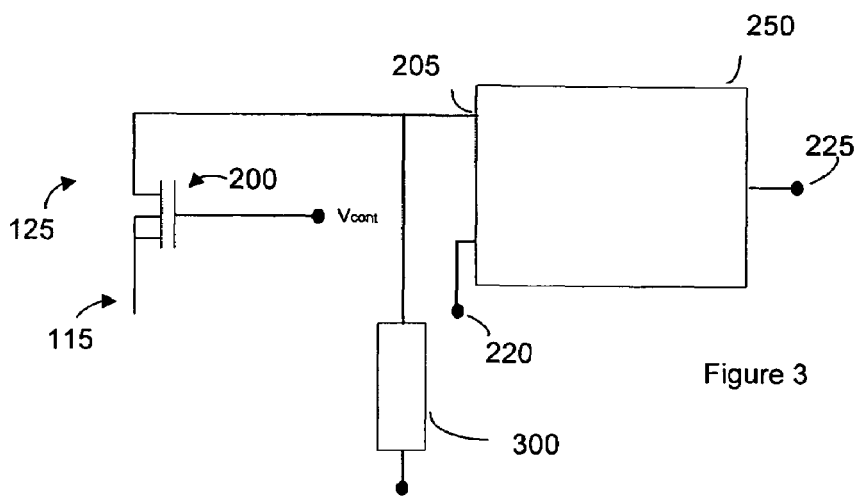
FIG. 3 is a modification to the circuit of FIG. 2 including an impedance element.

An alternate approach is that the comparator function may include an impedance element 300, such as shown in FIG. 3, which translates the current signal to a voltage signal, and a voltage based comparator circuit. A low resolution flash analog to digital converter (ADC) can be used here or indeed a successive approximation register (SAR) ADC. Such functionality and the necessary configurations required to provide same will be well known to the person skilled in the art.

It will be appreciated that the MOS device couples the current signal to the comparator function. Delay elements, shown in schematic form in FIG. 4 as delay block 400, can also be added to desensitise the circuit from unwanted transient glitches, which may occur at the connection. Examples of delay elements include analog filter components such as simple RC circuit, LC circuit, switched capacitor arrangements or the like. The output of the comparator can also be digitally filtered by incorporating a delay block 405 at the output of the ADC. A monostable delay circuit can be used to achieve a simple, area efficient digital filter action. Although not shown it will be appreciated that a further delay could be provided between the pin 115 and the MOS device 200. The types of delay or filter circuitry that may be incorporated will be well known to those in the art. It will be appreciated that the delay block 400 could be considered as an analog filter such that the comparator may be provided with an analog filter at the input and a digital filter at the output.

Figure 4:
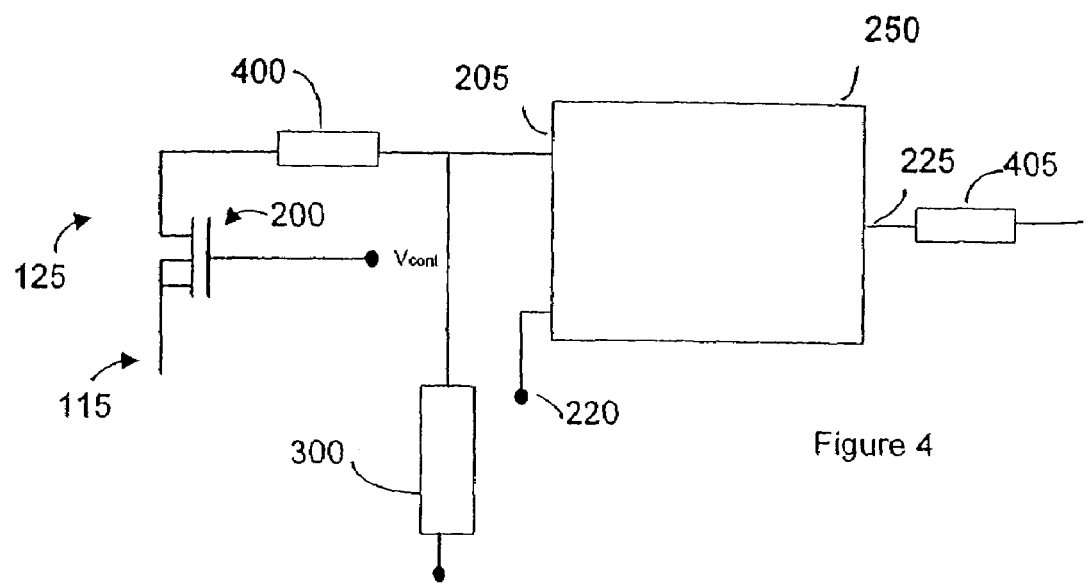
FIG. 4 is a modification to the circuit of FIG. 2 including delay elements provided at the input and output of the comparator circuitry.
Figure 4A:
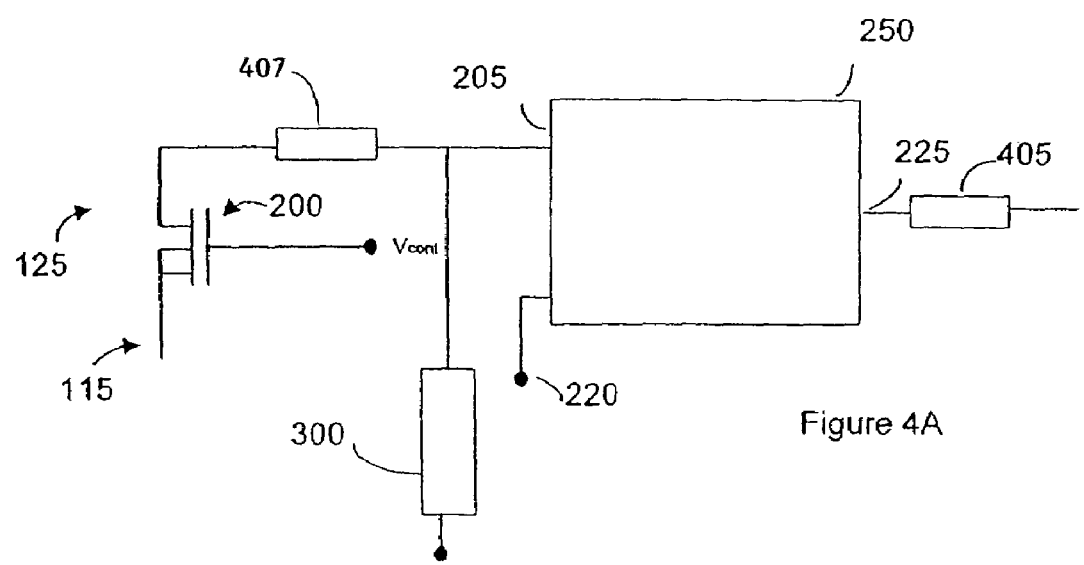
FIG. 4A is a modification to the circuit of FIG. 2 including a series device block provided at the input to the comparator circuitry.

In a modification to the arrangement of FIG. 4, shown in FIG. 4A, it will be understood that series devices 407 can be added, such as one or more additional MOS devices provided between the first MOS device 200 and the comparator, to block the current signal path. These series devices are shown schematically as a series device block 407. A resultant effect of such a clamp may be to clamp the output at a first level. It will be appreciated that the configuration of these MOS devices, if provided, may be suitably altered depending on the application. As is known to those skilled in the art, it will be possible to add further devices to clamp the output, as desired.

Figure 5:
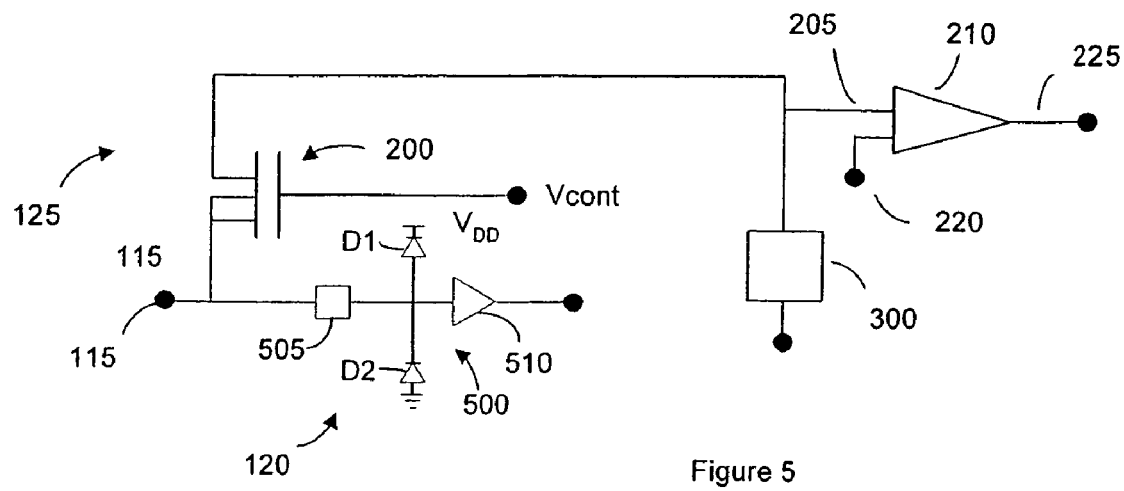
FIG. 5 is a schematic showing preferred circuit components for the first and second signal paths.

FIG. 5 is a schematic of a preferred embodiment of the invention showing the type of circuit components that may be provided within the first and second signal path. As discussed above, the second signal path includes a MOS transistor device, in this embodiment shown as a MOS device 200, which is configured such that the source and back gate of the device are both coupled to the pin. The drain of the PMOS device is coupled to a first input 205 of a comparator 210 and also to an impedance device 215, which may be provided as either an active or passive device. Examples of active devices include transistors and passive devices include resistors. A second input 220 of the comparator 210 is coupled to a reference signal, such that when the MOS devices goes from an "off" condition to an "on" condition, the inputs to the comparator change and a resultant mode sense output is provided on the output 225 of the comparator. The mode sense output can be coupled to other circuitry, as will be appreciated by those skilled in the art, to activate or de-activate certain conditions of program sequences. It will be further appreciated that the comparator may be provided as an inverter which may be self-biased.

The gate of the MOS device is coupled to a control voltage $V_{cont}$. During normal operating conditions of the circuit, the voltage applied to the pin, $V_{pin} < V_{cont}$ and the PMOS device is off. As a result the comparator is off, and if the comparator is provided as an inverter, there will be no power consumed by the second signal path and as a result no leakage. It will appear as if the second signal path is not present.

When the voltage applied to the pin is greater than $V_{cont}$ and a certain threshold voltage, $V_{TH}$, such that $V_{pin} > V_{cont} + V_{TH}$, the pin sources current through the PMOS device so as to develop a voltage across the impedance. This developed voltage then trips the comparator, changes the output and can be used—as mentioned above—to activate or deactivate other circuit components as will be appreciated by those skilled in the art.

It will be appreciated that the circuit components of the first signal path can be chosen depending on the application as the operation of the second signal path does not require any specific configuration of those other components—it is independently operable. Examples of such known pad cell circuits are disclosed in U.S. Pat. No. 5,602,409 and U.S. Pat. No. 5,751,525 both of which are co-assigned to the assignees of the present invention and are incorporated herein by reference. FIG. 5 shows a typical example of the type of components that may be provided in the first signal path to protect the internal circuitry from electrostatic discharge events. In this embodiment the first signal path includes an up/down diode configuration D1/D2 (500), coupled to a series impedance 505, typically a resistor, that is in turn coupled to a digital buffer 510. In operation, such a configuration acts to clamp the external discharge to ground or to $V_{DD}$, thereby limiting the potential applied to the internal circuit components. The resistor is provided to avoid damaging either of the two diodes due to the large currents that would otherwise flow from the external source. Any noise associated with the resistor is reduced by the presence of the buffer 510. An alternative configuration may include an impedance element coupled between the diode configuration and the digital buffer.

The circuitry of the second signal path can operate in parallel with such structures and provides additional pin functionality to known pad cell arrangements. The second signal path can operate in parallel and simultaneously with the primary function of the pad cell and no switching/multiplexing required is required to activate or deactivate the circuitry. As such, it provides for a maximization of the usage of the pin(s), can provide for a reduction in pin count, package area, package cost and the number of PCB signals. It will be understood that as the configuration of the present invention provides for a lower number of pins that it also provides for a lower number of PCB signals to be used.

A preferred application of the second signal path is for test mode entry where it is required to implement certain functions, modes and/or routines within the internal circuitry of the IC for manufacturing test purposes. This function can be used to enable programmability and calibration during manufacturing. Using the arrangement of the present invention it is possible to access these functions, modes and/or routines simply by applying the voltage at the pin at a value greater than the control voltage. There is therefore no requirement for complications in the form of multiplexing digital interface pins between entering/leaving test mode and test mode digital access. In such applications it is possible for the test mode signal path to be used in the manufacturing process, and once the necessary parameters have been set or established that this path can be permanently disabled by blowing a fuse or similar action.

In further embodiments of the invention it is possible to alternate between the first and second signal paths. Such behavior may be achieved by, for example, providing a second MOS device between the input pin and the first MOS device, the second MOS device being configured in the same manner as the first with the source and well coupled to the same potential. The provision of such a configuration could be used to set a first set of user parameters for controlling when the first signal path is operable and a second set of user parameters when the second signal path is operable.

It will be appreciated that although the present invention has been described with reference to MOS components and that the MOS acronym denotes a Metal Oxide Semiconductor, that such devices can and are made using different gate materials other than metal e.g., polysilicon and different dielectric isolation materials other than oxide e.g., tantalum-tungsten. Within the present invention it is intended that such modifications to the traditional MOS structures or materials will be encompassed within the term MOS.

It will be further appreciated that although the present invention has been described with reference to preferred embodiments that will be apparent that modifications can be made without departing from the spirit and scope of the invention. It is not intended that the invention be limited in any way except as may be deemed necessary in the light of the appended claims.

The words comprises/comprising when used in this specification are to specify the presence of stated features, integers, steps or components but does not preclude the presence or addition of one or more other features, integers, steps, components or groups thereof.

The invention claimed is:

1. An integrated circuit comprising, on a single die, at least one external connection pin, the pin being coupled to a pad cell adapted to provide a signal path from circuitry external to the integrated circuit via the pin to components of the integrated circuit, and wherein the pad cell includes a first signal path which is operational under a first set of normal operating conditions and a second signal path, the second signal path being non-operable under the first set of normal operating conditions and operable on application of a pre-defined signal to the pin, the operation of the second signal path being parallel to and simultaneous with the operation of the first signal path.

2. The circuit as claimed in claim 1 wherein the second signal path includes a MOS transistor device, the source and well of the device being coupled to one another.

3. The circuit as claimed in claim 2 wherein the source and well are coupled to the pin.

4. The circuit as claimed in claim 2 wherein the second signal path additionally includes comparator circuitry.

5. The circuit as claimed in claim 4 wherein the comparator circuitry includes a digital gate.

6. The circuit as claimed in claim 4 wherein the comparator circuitry includes an analog amplifier.

7. The circuit as claimed in claim 6 wherein the amplifier is configured as an inverter.

8. The circuit as claimed in claim 4 wherein the comparator circuitry is coupled in series to a first MOS device.

9. The circuit as claimed in claim 4 wherein the second signal path is additionally coupled to an impedance device such that when the second signal path is operable, the pin sources current through the MOS device across the impedance, thereby causing the comparator circuitry to change its output.

10. The circuit as claimed in claim 9 wherein the impedance device is an active component.

11. The circuit as claimed in claim 9 wherein the impedance device is a passive component.

12. The circuit as claimed in claim 1 wherein the second signal path may be replicated such that the pad cell provides multiple signal paths that may be operable simultaneously with and in parallel to the first signal path.

13. The circuit as claimed in claim 12 wherein each of the multiple signal paths of the pad cell are individually operable such that at any one time only one signal path of the multiple signal paths is operable.

14. The circuit as claimed in claim 1 wherein the predefined signal is a signal of larger magnitude than the first set of normal operating conditions.

15. The circuit as claimed in claim 4 wherein the comparator circuitry includes a first input coupled to the MOS device, a second input adapted to provide a signal with which the signal coupled from the MOS device is compared with and an output, the output depending on the comparison effected between the first and second inputs.

16. The circuit as claimed in claim 15 wherein the comparator circuitry is configured as a current comparator.

17. The circuit as claimed in claim 15 wherein the comparator circuitry is configured as a voltage comparator.

18. The circuit as claimed in claim 15 wherein an analog filter is provided between the MOS device and the comparator circuitry.

19. The circuit as claimed in claim 15 wherein a digital filter is provided at the output of the comparator circuitry.

20. The circuit as claimed in claim 15 wherein the comparator circuitry is configured as a SAR ADC.

21. The circuit as claimed in claim 15 wherein the comparator circuitry is configured as a flash ADC.

22. The circuit as claimed in claim 15 further comprising at least one additional MOS device provided in the path between the first MOS device and the input to the comparator circuitry.

23. The circuit as claimed in claim 1 wherein the first signal path includes an up/down diode configuration adapted to provide protection from electrostatic discharge events.

24. The circuit as claimed in claim 23 wherein the first signal path additionally includes an impedance element in series with the up/down diode configuration.

25. The circuit as claimed in claim 24 wherein the first signal path additionally includes a digital buffer in series with the up/down diode configuration.

26. An integrated circuit comprising, on a single die:
(a) internal circuitry,
(b) at least one external connection, and
(c) a pad cell electrically interposed between an external connection and the internal circuitry, the pad cell comprising
(1) a first group of components adapted to protect the internal circuitry from transients at the external connection and providing, during normal operating conditions of the integrated circuit, a first signal path to the internal circuitry, and
(2) a second group of components providing a second signal path from the external connection to the internal circuitry and wherein the second signal path is non-operable during the normal operating conditions but on application of a predefined voltage at the external connection becomes operable, the first and second signal paths being simultaneously operable.

27. The circuit as claimed in claim 26 wherein the second signal path includes a MOS device with the source and well coupled together, the gate of the MOS device being controllable by a control voltage, the MOS device being switchable between an off condition and an on condition, and wherein in the off condition the MOS device presents a high impedance to the external connection.

28. The circuit as claimed in claim 26 wherein the second group of components includes a comparator, the comparator adapted to compare a first signal applied at the external connection with a second signal and provide an output dependent on that comparison.

29. The circuit as claimed in claim 28 wherein the comparator is configured as a current comparator.

30. The circuit as claimed in claim 28 wherein the comparator is configured as a voltage comparator.

31. The circuit as claimed in claim 26 wherein the second group of components include at least one filter.

32. The circuit as claimed in claim 31 wherein the filter is an analog filter.

33. The circuit as claimed in claim 31 wherein the filter is a digital filter.

34. An integrated circuit comprising, on a single die:
(a) internal circuitry,
(b) at least one external connection, and
(c) a pad cell electrically interposed between a said external connection and the internal circuitry, the pad cell comprising
(1) a first group of components providing, during normal operating conditions of the integrated circuit, a first signal path to the internal circuitry, and
(2) a second group of components providing a second signal path from the external connection to the internal circuitry and wherein the second signal path is non-operable during the normal operating conditions but on application of a predefined voltage at the external connection becomes operable, the second group of components including a MOS device having the source and well coupled together, the application of the predefined voltage turning the MOS device on and enabling the second signal path.

35. The circuit as claimed in claim 34 wherein the pad cell further includes circuit components adapted to protect the internal circuitry from transients at the external connection.

36. The circuit as claimed in claim 35 wherein the circuit components adapted to protect the internal circuitry from transients at the external connection are provided in one or other of the first and second signal paths.

37. The circuit as claimed in claim 35 wherein the circuit components adapted to protect the internal circuitry from transients at the external connection are provided in the first signal path.

38. The circuit as claimed in claim 35 being configured such that during operation of the second signal path the first signal path in not operable.

39. The circuit as claimed in claim 38 wherein the first signal path is available for operation but is not operable.

40. The circuit as claimed in claim 38 wherein the first signal path is disabled.

41. The circuit as claimed in claim 35 wherein the second signal path includes components which may be configured to disable the second signal path.

42. The circuit as claimed in claim 41 wherein the second signal path may be permanently disabled.

43. The circuit as claimed in claim 34 further including components which may be configured to disable the second signal path during the application of the predetermined voltage at the external connection.

44. The circuit as claimed in claim 43 wherein the second signal path may be permanently disabled.

* * * * *